United States Patent
Jeon et al.

(10) Patent No.: US 9,768,102 B2
(45) Date of Patent: Sep. 19, 2017

(54) INTEGRATED CIRCUIT PACKAGING SYSTEM WITH SUPPORT STRUCTURE AND METHOD OF MANUFACTURE THEREOF

(75) Inventors: Dong Ju Jeon, Seoul (KR); Koo Hong Lee, Seoul (KR); Sung Soo Kim, Seoul (KR)

(73) Assignee: STATS ChipPAC Pte. Ltd., Singapore (SG)

(*) Notice: Subject to any disclaimer, the term of this patent is extended or adjusted under 35 U.S.C. 154(b) by 36 days.

(21) Appl. No.: 13/425,768

(22) Filed: Mar. 21, 2012

(65) Prior Publication Data

US 2013/0249078 A1 Sep. 26, 2013

(51) Int. Cl.
*H01L 23/498* (2006.01)
*H01L 21/48* (2006.01)
*H01L 23/31* (2006.01)

(52) U.S. Cl.
CPC ...... *H01L 23/49827* (2013.01); *H01L 21/486* (2013.01); *H01L 23/3128* (2013.01); *H01L 23/49816* (2013.01); *H01L 2224/48091* (2013.01)

(58) Field of Classification Search
CPC . H01L 2924/00014; H01L 2224/32225; H01L 2224/48227; H01L 2224/73265; H01L 2224/484; H01L 2924/15311; H01L 21/6835; H01L 2221/68345; H01L 2224/27013; H01L 2224/32188; H01L 23/3128; H01L 23/49816; H01L 23/49827; H01L 24/29; H01L 24/32; H01L 24/48; H01L 21/486
See application file for complete search history.

(56) References Cited

U.S. PATENT DOCUMENTS

| | | | |
|---|---|---|---|
| 6,930,256 B1* | 8/2005 | Huemoeller | H01L 21/4857 174/255 |
| 8,225,502 B2 | 7/2012 | Kaneko | |
| 2002/0192872 A1* | 12/2002 | Fujisawa | H01L 21/565 438/123 |
| 2008/0115355 A1 | 5/2008 | Park et al. | |
| 2008/0264684 A1 | 10/2008 | Kang et al. | |
| 2008/0272464 A1* | 11/2008 | Do | H01L 21/6835 257/620 |
| 2009/0025210 A1 | 1/2009 | Lee et al. | |
| 2009/0309197 A1* | 12/2009 | Chow | H01L 21/563 257/659 |
| 2010/0052164 A1* | 3/2010 | Lee | H01L 23/3114 257/738 |
| 2010/0237471 A1* | 9/2010 | Pagaila | H01L 21/486 257/621 |
| 2011/0084370 A1* | 4/2011 | Su | H01L 21/6835 257/669 |
| 2011/0169150 A1 | 7/2011 | Su et al. | |
| 2011/0186342 A1 | 8/2011 | Kim et al. | |
| 2012/0326331 A1* | 12/2012 | Han | H01L 25/105 257/777 |

* cited by examiner

*Primary Examiner* — Cuong B Nguyen
*Assistant Examiner* — Juanita Rhodes
(74) *Attorney, Agent, or Firm* — Wong & Rees LLP (57) ABSTRACT

A method of manufacture of an integrated circuit packaging system includes: forming a one-layer substrate with a symmetrical structure, the one-layer substrate having a redistribution pad and an insulation, the redistribution pad only at an insulation top side of the insulation; mounting an integrated circuit over the one-layer substrate; and forming an encapsulation over the integrated circuit.

19 Claims, 5 Drawing Sheets

INTEGRATED CIRCUIT PACKAGING SYSTEM WITH SUPPORT STRUCTURE AND METHOD OF MANUFACTURE THEREOF

TECHNICAL FIELD

The present invention relates generally to an integrated circuit packaging system, and more particularly to a system for an integrated circuit packaging system with support structure.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a one-layer substrate with a symmetrical structure, the one-layer substrate having a redistribution pad and an insulation, the redistribution pad only at an insulation top side of the insulation; mounting an integrated circuit over the one-layer substrate; and forming an encapsulation over the integrated circuit.

The present invention provides an integrated circuit packaging system, including: a one-layer substrate includes: a one-layer substrate with a symmetrical structure, the one-layer substrate having a redistribution pad and an insulation, the redistribution pad only at an insulation top side of the insulation; an integrated circuit over the one-layer substrate; and an encapsulation over the integrated circuit.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 1:
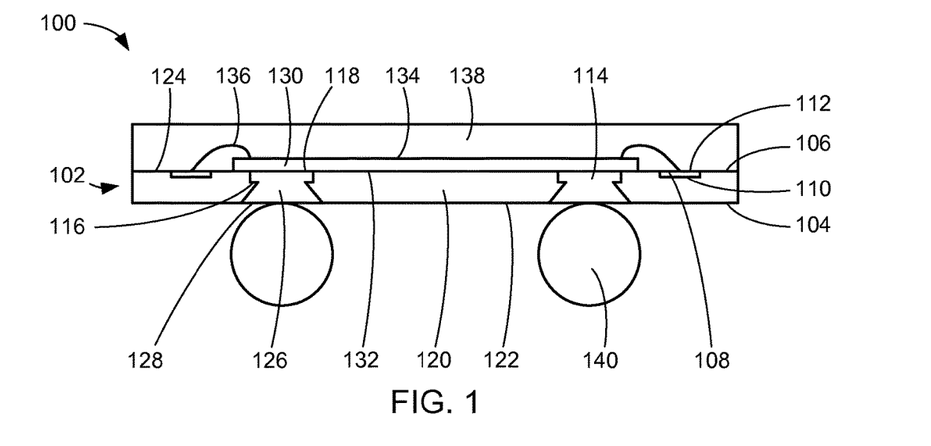
FIG. 1 is a cross-sectional view of an integrated circuit packaging system taken along line 1-1 of FIG. 2 in an embodiment of the present invention.
Figure 2:
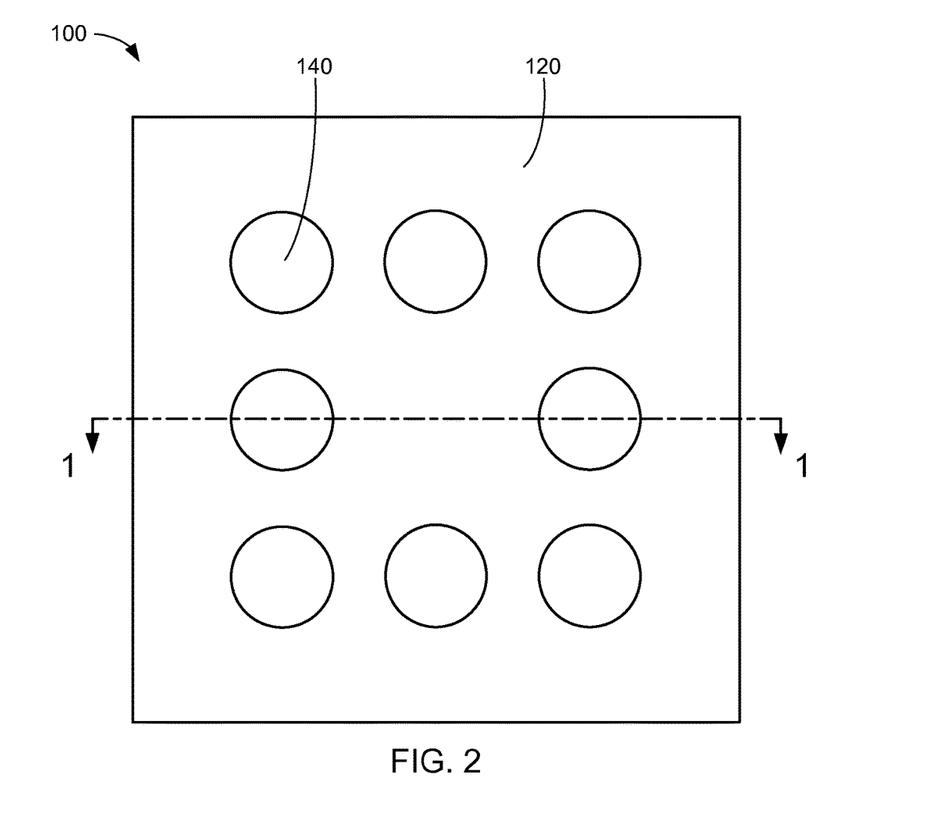
FIG. 2 is a bottom view of the integrated circuit packaging system.

Referring now to FIG. 1, therein is shown a cross-sectional view of an integrated circuit packaging system 100 taken along line 1-1 of FIG. 2 in an embodiment of the present invention. The integrated circuit packaging system 100 represents a structure and a manufacturing method of one-layer thin substrate.

The integrated circuit packaging system 100 can include a one-layer substrate 102, which is defined as a symmetrical support structure having only a single layer of an insulation material for mounting and connecting a semiconductor device thereto including providing electrical connections through the support structure. The one-layer substrate 102 can include a substrate bottom side 104 and a substrate top side 106.

The one-layer substrate 102 can include attachment pads 108, which are defined as electrically conductive structures for attaching electrical connectors thereto. Each of the attachment pads 108 can include an attachment pad bottom side 110 and an attachment pad top side 112. The attachment pads 108 can be formed at the substrate top side 106.

The one-layer substrate 102 can include redistribution pads 114, which are defined as electrically conductive structures for attaching electrical connectors thereto. Each of the redistribution pads 114 can include a redistribution pad bottom side 116 and a redistribution pad top side 118. The redistribution pads 114 can be formed at the substrate top side 106. The redistribution pads 114 and the attachment pads 108 can be formed as part of a redistribution layer (not shown) having conductive traces (not shown) electrically connecting the redistribution pads 114 and the attachment pads 108.

The one-layer substrate 102 can include an insulation 120, which is defined as a layer that provides electrical isolation and protection. The insulation 120 can include an insulation bottom side 122 and an insulation top side 124. The attachment pads 108 and the redistribution pads 114 can be formed only at the insulation top side 124.

The one-layer substrate 102 includes a single layer structure of an insulation material since the insulation 120 is the only layer that determines a thickness or a vertical height of the one-layer substrate 102. The one-layer substrate 102 also includes a symmetrical structure with respect to the center of the insulation 120. The symmetrical structure is defined as the one-layer substrate 102 having equal bottom and top portions to prevent warpage.

The one-layer substrate 102 includes the symmetrical structure since the one-layer substrate 102 does not include an additional layer over the insulation layer 120 that would cause a top portion of the one-layer substrate 102 not equal to or thicker than a bottom portion of the one-layer substrate 102. For example, the additional layer can include a solder resist (SR) or polymer material. The one-layer substrate 102 having the symmetrical structure provides matching of coefficient of thermal expansions (CTE) among the redistribution pads 114, the insulation 120, and vertical connectors 126. The symmetrical structure will be further described in subsequent sections.

The one-layer substrate 102 can include the vertical connectors 126, which are defined as electrically conductive connectors. Each of the vertical connectors 126 can include a vertical connector bottom side 128. One of the vertical connectors 126 can be formed through the insulation 120 and directly on one of the redistribution pads 114.

The integrated circuit packaging system 100 can include an integrated circuit 130, which is defined as a device having active circuitry fabricated thereon. The integrated circuit 130 can include an inactive side 132 and an active side 134. For example, the integrated circuit 130 can represent a semiconductor device including an integrated circuit die or a flip chip. The attachment pads 108 can be formed outside a non-horizontal extent of the integrated circuit 130.

The integrated circuit 130 can be mounted over the one-layer substrate 102 with the inactive side 132 facing the substrate top side 106. The redistribution pads 114 and the vertical connectors 126 can be formed directly under the integrated circuit 130. The attachment pads 108 can be only outside a non-horizontal extent of the integrated circuit 130. Although the integrated circuit 130 is shown directly on the substrate top side 106, although it is understood that the integrated circuit packaging system 100 can include an attach layer (not shown) for attaching the inactive side 132 to the substrate top side 106 including the insulation top side 124.

The integrated circuit packaging system 100 can include internal connectors 136, which are defined as electrically conductive connectors. One of the internal connectors 136 can be attached to the attachment pad top side 112 and the active side 134. For example, the internal connectors 136 can represent electrically conductive connectors including bond wires or conductive bumps.

The integrated circuit packaging system 100 can include an encapsulation 138, which is defined as a package cover of a semiconductor package to hermetically seal the semiconductor device as well as providing mechanical and environmental protection. The encapsulation 138 can be formed over the substrate top side 106, the integrated circuit 130, and the internal connectors 136. The attachment pad top side 112 can be covered only by the encapsulation 138.

A bottom extent of the encapsulation 138, the insulation top side 124, the redistribution pad top side 118, and the attachment pad top side 112 can be approximately coplanar with each other. The vertical connector bottom side 128 can be approximately coplanar with the insulation bottom side 122.

The integrated circuit packaging system 100 can include external connectors 140, which are defined as electrically conductive connectors. The external connectors 140 can be attached to the vertical connector bottom side 128 and an external system (not shown). The external connectors 140 can represent electrically conductive connectors including conductive balls or conductive bumps. The integrated circuit 130 can be electrically connected to the external system with the internal connectors 136, the attachment pads 108, the redistribution pads 114, the vertical connectors 126, and the external connectors 140.

It has been discovered that the one-layer substrate 102 having the symmetrical structure provides improved reliability by reducing or eliminating high warpage problems that would occur during manufacture of conventional one-layer substrates with solder resist (SR) or polymer layer as well as providing reduced substrate manufacturing process, reduced material, cost saving. The high warpage problems occur because the solder resist layer introduces additional thickness to the conventional one-layer substrates resulting in the conventional one-layer substrates having asymmetrical structures (SR-Cu-PPG-Cu) with mismatch of coefficient of thermal expansions (CTE) among three material layers of metal (including Cu), polymer (including SR or resin), and glass fabric (including PPG), caused by variable thermal processes and with global distortion caused by localized and inner stress between the layers.

Referring now to FIG. 2, therein is shown a bottom view of the integrated circuit packaging system 100. The bottom view depicts an array of the external connectors 140 at an interior portion of the insulation 120. For illustrative purposes, the array is shown with one row of the external connectors 140 along each peripheral side of the insulation 120, although it is understood that the array can include any number of rows of the external connectors 140.

Figure 3:
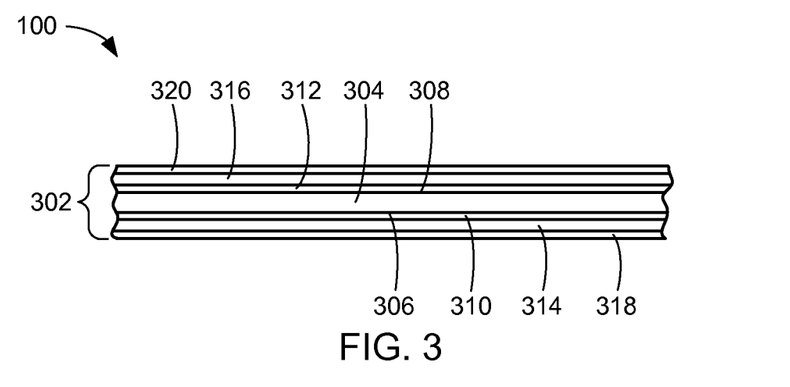
FIG. 3 is a cross-sectional view of the integrated circuit packaging system in a preparation phase of manufacture.

Referring now to FIG. 3, therein is shown a cross-sectional view of the integrated circuit packaging system 100 in a preparation phase of manufacture. The integrated circuit packaging system 100 can include a carrier 302 to provide a support structure for forming the one-layer substrate 102 of FIG. 1.

The carrier 302 can include an internal layer 304 having an internal layer bottom side 306 and an internal layer top side 308. The carrier 302 can include a bottom intermediate layer 310 and a top intermediate layer 312 attached directly on the internal layer bottom side 306 and the internal layer top side 308, respectively.

For example, the internal layer 304 can be formed with an insulation material including epoxy, fiberglass, and FR4. Also for example, the bottom intermediate layer 310 and the top intermediate layer 312 can be formed with a conductive material including a copper (Cu) foil. The purpose of using the internal layer 304, the bottom intermediate layer 310, and the top intermediate layer 312 is to do double-side substrate manufacturing with an advantage of two times production capability per one time manufacturing.

The carrier 302 can include a first bottom conductive layer 314 and a first top conductive layer 316, which are defined as electrically conductive layers. The first bottom conductive layer 314 and the first top conductive layer 316 can be formed directly on the bottom intermediate layer 310 and the top intermediate layer 312, respectively. The first bottom conductive layer 314 and the first top conductive layer 316 can be formed with a conductive material including copper (Cu), a metallic material, or a metal alloy.

The carrier 302 can include a second bottom conductive layer 318 and a second top conductive layer 320, which are defined as electrically conductive layers. The second bottom conductive layer 318 and the second top conductive layer 320 can be formed directly on the first bottom conductive layer 314 and the first top conductive layer 316, respectively. The second bottom conductive layer 318 and the second top conductive layer 320 can be formed with a conductive material including nickel (Ni), a metallic material, or a metal alloy.

Figure 4:
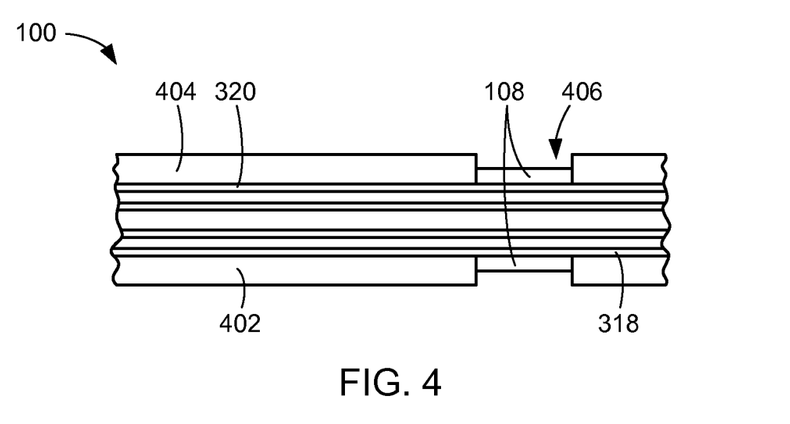
FIG. 4 is the structure of FIG. 3 in a first patterning phase.

Referring now to FIG. 4, therein is shown the structure of FIG. 3 in a first patterning phase. The first patterning phase can include a metal-1 (M1) patterning process. The first patterning phase can include a patterning process including surface plating.

The integrated circuit packaging system 100 can include a first bottom mask 402 and a first top mask 404 formed directly on the second bottom conductive layer 318 and the second top conductive layer 320, respectively. For example, the first bottom mask 402 and the first top mask 404 can represent a mask layer including dry film, photoresist layer, or dielectric.

The first bottom mask 402 and the first top mask 404 can be patterned to form first holes 406. One of the first holes 406 can be formed through the first bottom mask 402. Another of the first holes 406 can be formed through the first top mask 404. The first holes 406 can expose portions of the second bottom conductive layer 318 and the second top conductive layer 320.

The attachment pads 108 can be formed directly on the portions of the second bottom conductive layer 318 and the second top conductive layer 320. The attachment pads 108 can be formed within the first holes 406. The attachment pads 108 can be formed with a conductive material including copper (Cu), a metallic material, or a metal alloy.

Figure 5:
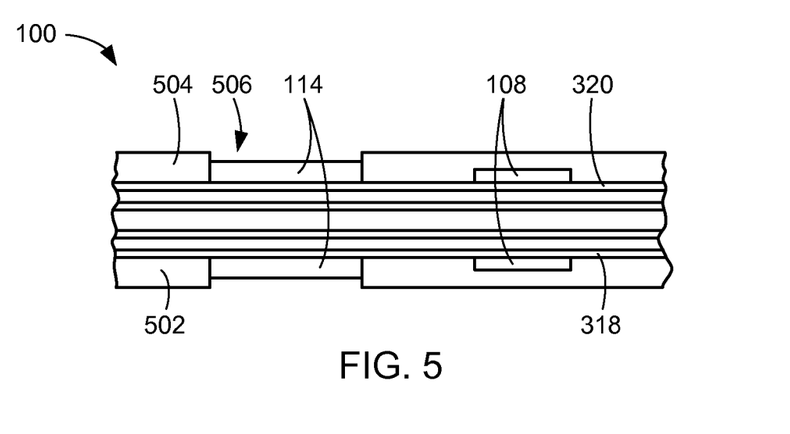
FIG. 5 is the structure of FIG. 4 in a second patterning phase.

Referring now to FIG. 5, therein is shown the structure of FIG. 4 in a second patterning phase. The second patterning phase can include a metal-1 (M1) patterning process. The second patterning phase can include a patterning process including surface plating. The first bottom mask 402 of FIG. 4 and the first top mask 404 of FIG. 4 can be removed or stripped after the attachment pads 108 are formed in the first patterning phase.

The integrated circuit packaging system 100 can include a second bottom mask 502 and a second top mask 504 formed directly on the second bottom conductive layer 318 and the second top conductive layer 320, respectively. The second bottom mask 502 and the second top mask 504 can cover the attachment pads 108. For example, each of the second bottom mask 502 and the second top mask 504 can represent a mask layer including dry film, photoresist layer, or dielectric.

The second bottom mask 502 and the second top mask 504 can be patterned to form second holes 506. One of the second holes 506 can be formed through the second bottom mask 502. Another of the second holes 506 can be formed through the second top mask 504. The second holes 506 can expose portions of the second bottom conductive layer 318 and the second top conductive layer 320.

The redistribution pads 114 can be formed directly on the portions of the second bottom conductive layer 318 and the second top conductive layer 320. The redistribution pads 114 can be formed within the second holes 506. The redistribution pads 114 can be formed with a conductive material including copper (Cu), a metallic material, or a metal alloy.

The integrated circuit packaging system 100 can include redistribution layers (not shown) formed with conductive traces (not shown), the redistribution pads 114, and the attachment pads 108 for distributing electrical signals between the attachment pads 108 and the redistribution pads 114. One of the redistribution pads 114 can be electrically connected to one of the attachment pads 108. The attachment pads 108 can represent bond fingers that are formed together with patterns of the conductive traces.

Each of the redistribution pads 114 can have a vertical height greater than a vertical height of each of the attachment pads 108. For example, each of the redistribution pads 114 can have a vertical height greater than a vertical height of each of the attachment pads 108 and less than two times a vertical height of each of the attachment pads 108. Vertical heights of the attachment pads 108 and the redistribution pads 114 provide a portion of a predetermined thickness of the one-layer substrate 102 of FIG. 1.

Each of the redistribution pads 114 can have a horizontal width greater than a horizontal width of each of the attachment pads 108. For example, each of the redistribution pads 114 can have a horizontal width greater than a horizontal width of each of the attachment pads 108 and less than two times a horizontal width of each of the attachment pads 108.

The redistribution pads 114 can include a vertical height of a minimum of 10 micrometers (um). The redistribution pads 114 can include a horizontal width based on a package ball pitch. For example, if the package ball pitch is 0.5 millimeters (mm), the redistribution pads 114 can include a horizontal width of approximately 190 um to 240 um.

It has been discovered that vertical heights of the attachment pads 108 and the redistribution pads 114 provide improved reliability since the vertical heights provide a portion of the predetermined thickness of the one-layer substrate 102, which is an important factor for improved structural integrity of the one-layer substrate 102 to control substrate warpage.

Figure 6:
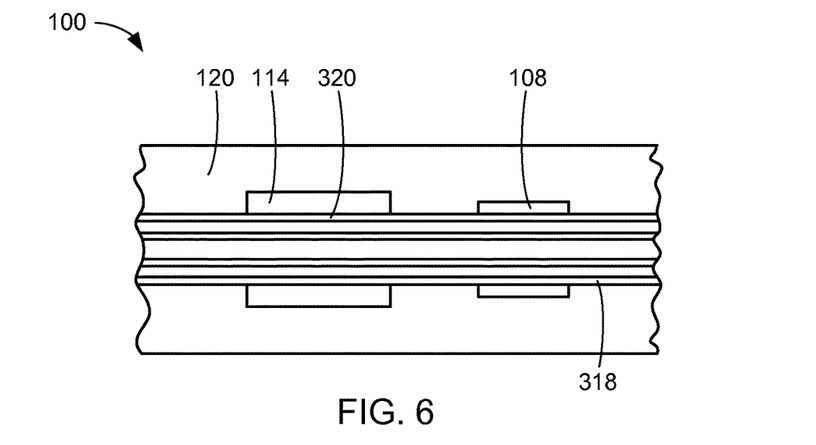
FIG. 6 is the structure of FIG. 5 in a lamination phase.

Referring now to FIG. 6, therein is shown the structure of FIG. 5 in a lamination phase. The second bottom mask 502 of FIG. 5 and the second top mask 504 of FIG. 5 can be removed or stripped after the redistribution pads 114 are formed in the second patterning phase.

The insulation 120 can be formed directly on the second bottom conductive layer 318 and the second top conductive layer 320. The insulation 120 can cover the attachment pads 108 and the redistribution pads 114. The insulation 120 can be formed with an insulation material including prepreg (PPG) material, glass fabric, resin, or fiber-reinforced material. The insulation 120 provides strength for the one-layer substrate 102 of FIG. 1 resulting in improved structural integrity of the one-layer substrate 102.

Figure 7:
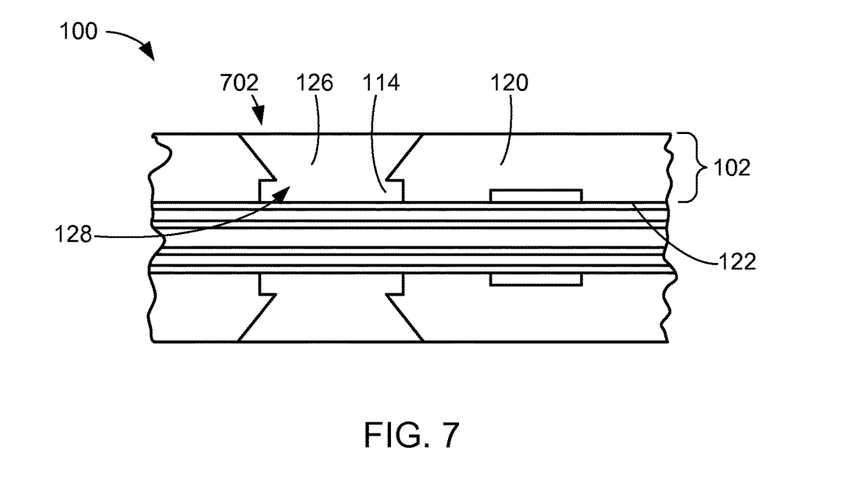
FIG. 7 is the structure of FIG. 6 in a connector-formation phase.

Referring now to FIG. 7, therein is shown the structure of FIG. 6 in a connector-formation phase. Insulation holes 702 can be formed or drilled through a top extent of the insulation 120 to expose portions of top extents of the redistribution pads 114. The vertical connectors 126 can be formed within the insulation holes 702. The vertical connectors 126 can be directly on the portions of the top extents of the redistribution pads 114.

The vertical connectors 126 can be formed or plated with a conductive material including copper (Cu), a metallic material, or a metal alloy. The vertical connectors 126 and the redistribution pads 114 can be formed with the same material. For illustrative purposes, the vertical connector bottom side 128 is shown approximately coplanar with the insulation bottom side 122, although it is understood that the vertical connector bottom side 128 can be below or above the insulation bottom side 122. Also for illustrative purposes, the vertical connectors 126 and the redistribution pads 114 appears to be a single integral structure, although it is understood that the vertical connectors 126 and the redistribution pads 114 can be formed with two separate conductive layers.

Bottom extents of the vertical connectors 126 can be approximately coplanar with a bottom extent of the insulation 120. A horizontal width of each of bottom extents of the vertical connectors 126 can be greater than a horizontal width of each of top extents of the vertical connectors 126. A horizontal width of each of top extents of the vertical connectors 126 can be smaller than a horizontal width of each of the redistribution pads 114.

A vertical height of each of the vertical connectors 126 can be greater than a vertical height of each of the redistribution pads 114. For example, a vertical height of each of the vertical connectors 126 can be greater than two times a vertical height of each of the redistribution pads 114 and less than three times a vertical height of each of the redistribution pads 114.

A horizontal width of each of the bottom extents of the vertical connectors 126 can be greater than a horizontal width of each of the redistribution pads 114. For example, a horizontal width of each of the bottom extents of the vertical connectors 126 can be greater than a horizontal width of each of the redistribution pads 114 and less than two times a horizontal width of each of the redistribution pads 114.

A vertical height of each of the vertical connectors 126 can depend on a substrate thickness. For example, the vertical height can be in an approximate range of 55 micrometers (um) to 65 um based on the substrate thickness of approximately 110 um.

A horizontal width of each of the vertical connectors 126 can depend on a package ball pitch. For example, if the package ball pitch is 0.5 millimeters (mm), the horizontal width can be in an approximate range of 245 um to 305 um.

The one-layer substrate 102 provides a one-layer structure without a solder resist (SR) layer. The one-layer substrate 102 also provides the one-layer structure without a bottom pad patterning process that uses a copper (Cu) foil or seed layer for electrolytic plating.

It has been discovered that vertical heights of the vertical connectors 126 and the redistribution pads 114 provide improved reliability since the vertical heights provide the predetermined thickness of the one-layer substrate 102, which is an important factor for controlling substrate warpage.

Figure 8:
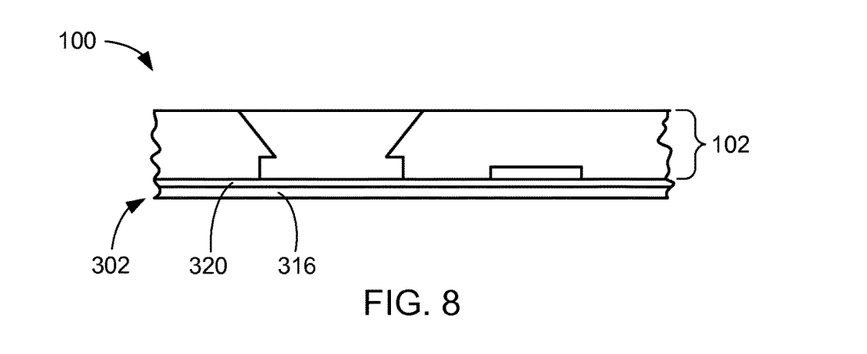
FIG. 8 is the structure of FIG. 7 in a separation phase.

Referring now to FIG. 8, therein is shown the structure of FIG. 7 in a separation phase. A bottom portion of the structure of FIG. 7 can be separated from a top portion of the structure of FIG. 7 by removing the internal layer 304 of FIG. 3, the bottom intermediate layer 310 of FIG. 3, and the top intermediate layer 312 of FIG. 3.

The one-layer substrate 102 is shown directly on a multi-layer structure including preferably the first top conductive layer 316 and the second top conductive layer 320. Another of the multi-layer structure can include the first bottom conductive layer 314 of FIG. 3 and the second bottom conductive layer 318 of FIG. 3. The one-layer substrate 102 can be detached from a portion of the carrier 302 including the internal layer 304, the bottom intermediate layer 310, and the top intermediate layer 312.

The top portion can include a portion of the one-layer substrate 102 and the multi-layer structure. The bottom portion can include a portion of the one-layer substrate 102 and the another of the multi-layer structure. The bottom portion and the top portion can be similar to each other. For illustrative purposes, only the top portion is depicted.

Figure 9:
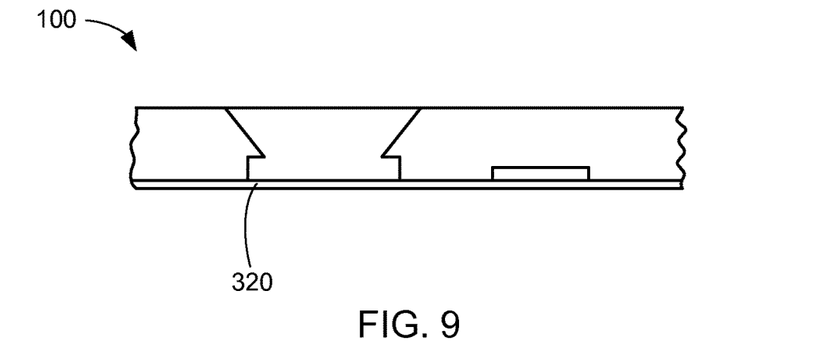
FIG. 9 is the structure of FIG. 8 in a first removal phase.

Referring now to FIG. 9, therein is shown the structure of FIG. 8 in a first removal phase. The first top conductive layer 316 of FIG. 3 can be removed to expose the second top conductive layer 320. The first top conductive layer 316 can be removed with a removal process including etching, polishing, or chemical-mechanical planarization (CMP).

The first top conductive layer 316 can be used as an etching barrier to enable selective etching. For example, the first top conductive layer 316 can be removed with etching by selective etching property.

Figure 10:
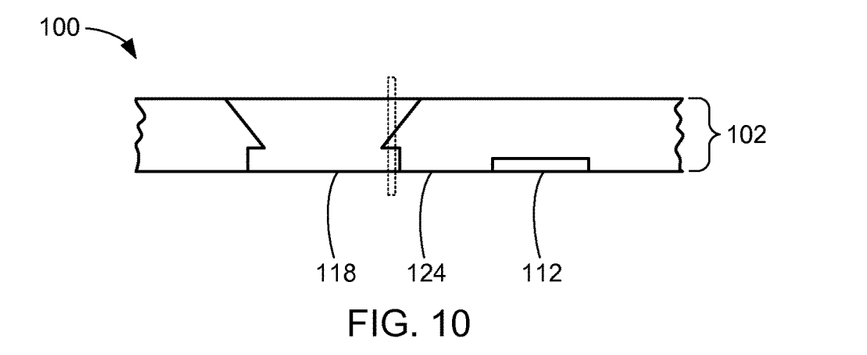
FIG. 10 is the structure of FIG. 9 in a second removal phase.

Referring now to FIG. 10, therein is shown the structure of FIG. 9 in a second removal phase. The second top conductive layer 320 of FIG. 3 can be removed to expose the attachment pad top side 112, the redistribution pad top side 118, and the insulation top side 124. The second top conductive layer 320 can be removed with a removal process including etching, polishing, or chemical-mechanical planarization (CMP).

The second top conductive layer 320 can be used as an etching barrier to enable selective etching. For example, the second top conductive layer 320 can be removed with etching by selective etching property.

The attachment pad top side 112, the redistribution pad top side 118, and the insulation top side 124 can include physical features characteristic of the second top conductive layer 320 removed. The physical features can include removal marks, approximately planar surfaces, surfaces free of delamination, or surfaces free of dishing. Dishing is defined as a characteristic of a surface that is dish-like, concave, or inwardly curved. For example, the removal marks can include etched marks or polished marks.

The one-layer substrate 102 can include the predetermined thickness. The one-layer substrate 102 can represent a thin substrate with the predetermined thickness in an approximate range of 90 micrometers (um) to 130 um.

It has been discovered that the multi-layer structure with the first top conductive layer 316 of FIG. 3 and the second top conductive layer 320 of FIG. 3 or with the first bottom conductive layer 314 of FIG. 3 and the second bottom conductive layer 318 of FIG. 3 provides improved reliability since the multi-layer structure effectively protects the one-layer substrate 102 from being removed providing improved thickness control of the one-layer substrate 102 to reduce or eliminate warpage. The multi-layer structure provides an advantage over conventional one-layer structures that have difficulty in removing copper (Cu) layers from detached carriers since it is difficult to control etching rate (or depth).

Figure 11:
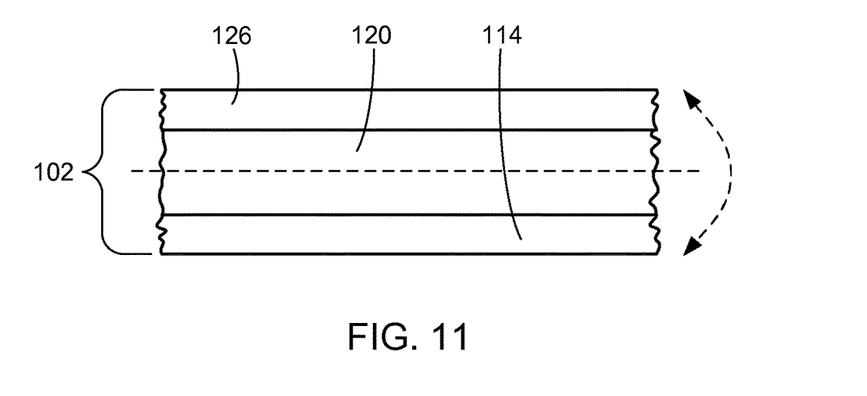
FIG. 11 is a portion of the one-layer substrate.

Referring now to FIG. 11, therein is shown a portion of the one-layer substrate 102. The one-layer substrate 102 includes a symmetrical structure. The symmetrical structure is shown with approximately equal portions of the one-layer substrate 102 that are below and above the center of the insulation 120, shown as a dash line. For illustrative purposes, the symmetrical structure is identified by a dash arrow in FIG. 11.

FIG. 11 depicts a portion of FIG. 10 that is indicated by a dash rectangle in FIG. 10. For illustrative purposes, a bottom extent of one of the vertical connectors 126 is shown as a horizontal line in FIG. 11, although it is understood that the bottom extent can be non-horizontal as shown in FIG. 10. The bottom extent is shown as a horizontal line for purposes of showing the symmetrical structure.

One of the equal portions below the center dash line, parallel with insulation bottom side 122 of FIG. 1, includes a lower portion of the insulation 120 and a portion of one of the vertical connectors 126. Another of the equal portions above the center dash line includes an upper portion of the insulation 120 and a portion of one of the redistribution pads 114. For example, the symmetrical structure can represent a structure of Cu-PPG-Cu.

It has been discovered that the one-layer substrate 102 having the symmetrical structure provides improved reliability compared to a conventional one-layer asymmetrical structure since the symmetrical structure has an advantage of reduction or elimination of warpage because of the matching and balance of coefficient of thermal expansions (CTE) during packaging processes with variable thermal conditions.

Figure 12:
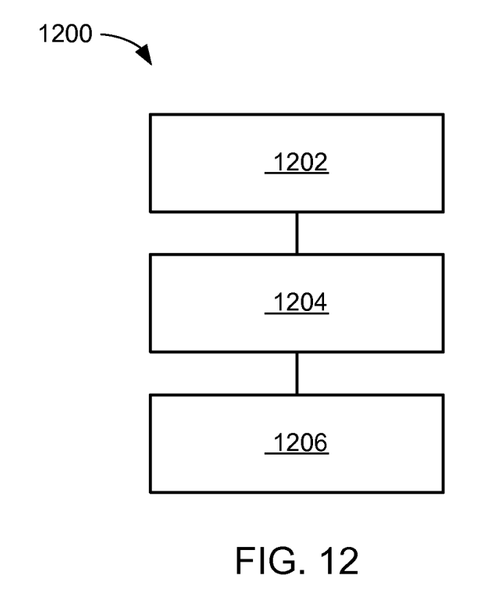
FIG. 12 is a flow chart of a method of manufacture of the integrated circuit packaging system of FIG. 1 in a further embodiment of the present invention.

Referring now to FIG. 12, therein is shown a flow chart of a method 1200 of manufacture of the integrated circuit packaging system 100 of FIG. 1 in a further embodiment of the present invention. The method 1200 includes: forming a one-layer substrate with a symmetrical structure, the one-layer substrate having a redistribution pad and an insulation, the redistribution pad only at an insulation top side of the insulation in a block 1202; mounting an integrated circuit over the one-layer substrate in a block 1204; and forming an encapsulation over the integrated circuit in a block 1206.

Thus, it has been discovered that the integrated circuit packaging system of the present invention furnishes important and heretofore unknown and unavailable solutions, capabilities, and functional aspects for an integrated circuit packaging system with support structure. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a one-layer substrate with a symmetrical structure, the one-layer substrate having an attachment pad, a redistribution pad, a vertical connector, and an insulation, the redistribution pad having a vertical height greater than a vertical height of the attachment pad and only at an insulation top side of the insulation, and the vertical connector having a height greater than a height of the redistribution pad, coplanar with a bottom side of the insulation, directly on the redistribution pad, within the insulation, and having a bottom width greater than a top width;
    mounting an integrated circuit over the one-layer substrate, the integrated circuit having an inactive side attached to the insulation top side of the insulation; and
    forming an encapsulation over the integrated circuit.

2. The method as claimed in claim 1 wherein forming the one-layer substrate includes forming the one-layer substrate having the attachment pad coplanar with the insulation.

3. The method as claimed in claim 1 wherein mounting the integrated circuit includes mounting the integrated circuit over the one-layer substrate with the redistribution pad directly under the integrated circuit.

4. The method as claimed in claim 1 wherein forming the one-layer substrate includes forming the one-layer substrate having the attachment pad only at the insulation top side of the insulation.

5. The method as claimed in claim 1 wherein mounting the integrated circuit includes mounting the integrated circuit over the one-layer substrate with the attachment pad only outside a non-horizontal extent of the integrated circuit.

6. A method of manufacture of an integrated circuit packaging system comprising:
  forming a one-layer substrate with a symmetrical structure, the one-layer substrate having an attachment pad, a redistribution pad, a vertical connector, and an insulation, the redistribution pad having a vertical height greater than a vertical height of the attachment pad and only at an insulation top side of the insulation, and the vertical connector having a height greater than a height of the redistribution pad, coplanar with a bottom side of the insulation, directly on the redistribution pad, within the insulation, and having a bottom width greater than a top width;
  mounting an integrated circuit over the one-layer substrate, the integrated circuit having an inactive side attached to the insulation top side of the insulation; and
  forming an encapsulation over the integrated circuit.

7. The method as claimed in claim 6 wherein forming the one-layer substrate includes forming the one-layer substrate having the attachment pad having an attachment pad top side coplanar with the insulation top side of the insulation.

8. The method as claimed in claim 6 wherein mounting the integrated circuit includes mounting the integrated circuit over the one-layer substrate with the redistribution pad and the vertical connector directly under the integrated circuit.

9. The method as claimed in claim 6 wherein forming the one-layer substrate includes forming the one-layer substrate having the attachment pad only at the insulation top side of the insulation, the attachment pad electrically connected to the redistribution pad.

10. The method as claimed in claim 6 wherein:
  mounting the integrated circuit includes mounting the integrated circuit over the one-layer substrate with the attachment pad only outside a non-horizontal extent of the integrated circuit; and
further comprising:
  attaching an internal connector to the integrated circuit and the attachment pad.

11. An integrated circuit packaging system comprising:
  a one-layer substrate with a symmetrical structure, the one-layer substrate having an attachment pad, a redistribution pad, a vertical connector, and an insulation, the redistribution pad having a vertical height greater than a vertical height of the attachment pad and only at an insulation top side of the insulation, and the vertical connector having a height greater than a height of the redistribution pad, coplanar with a bottom side of the insulation, directly on the redistribution pad, within the insulation, and having a bottom width greater than a top width;
  an integrated circuit over the one-layer substrate, the integrated circuit having an inactive side attached to the insulation top side of the insulation; and
  an encapsulation over the integrated circuit.

12. The system as claimed in claim 11 wherein the one-layer substrate includes the attachment pad coplanar with the insulation.

13. The system as claimed in claim 11 wherein the integrated circuit is over the one-layer substrate with the redistribution pad directly under the integrated circuit.

14. The system as claimed in claim 11 wherein the one-layer substrate includes the attachment pad only at the insulation top side of the insulation.

15. The system as claimed in claim 11 wherein the integrated circuit is over the one-layer substrate with the attachment pad only outside a non-horizontal extent of the integrated circuit.

16. The system as claimed in claim 11 wherein the one-layer substrate includes the attachment pad having an attachment pad top side coplanar with the insulation top side of the insulation.

17. The system as claimed in claim 11 wherein the integrated circuit is over the one-layer substrate with the redistribution pad and the vertical connector directly under the integrated circuit.

18. The system as claimed in claim 11 wherein the one-layer substrate includes the attachment pad only at the insulation top side of the insulation, the attachment pad electrically connected to the redistribution pad.

19. The system as claimed in claim 11 wherein:
  the integrated circuit is over the one-layer substrate with the attachment pad only outside a non-horizontal extent of the integrated circuit; and
further comprising:
  an internal connector attached to the integrated circuit and the attachment pad.

* * * * *